United States Patent [19]

Fukami

[11] Patent Number: 5,212,818
[45] Date of Patent: May 18, 1993

[54] RADIO STATION PRESETTING METHOD FOR RADIO RECEIVERS

[75] Inventor: Toshiyuki Fukami, Saitama, Japan

[73] Assignee: Pioneer Electrical Corporation, Tokyo, Japan

[21] Appl. No.: 631,311

[22] Filed: Dec. 21, 1990

[30] Foreign Application Priority Data

May 23, 1990 [JP] Japan ................... 2-131205

[51] Int. Cl.$^5$ ........................... H04B 17/02
[52] U.S. Cl. ...................... 455/186.1; 455/166.1
[58] Field of Search ............... 455/186.1, 186.2, 184.1, 455/185.1, 166.1, 166.2

[56] References Cited

U.S. PATENT DOCUMENTS

| | | | |
|---|---|---|---|
| 4,509,203 | 4/1985 | Yamada | 455/184.1 |
| 4,833,728 | 5/1989 | Kimura et al. | |
| 5,020,142 | 5/1991 | Shirasaka | 455/186.1 |
| 5,048,119 | 9/1991 | Wassink | 455/186.1 |

FOREIGN PATENT DOCUMENTS

| | | | |
|---|---|---|---|
| 3034155 | 3/1982 | Fed. Rep. of Germany | 455/161.3 |
| 2104744 | 3/1983 | United Kingdom | |

OTHER PUBLICATIONS

Abstract of German Patent No. De-31-49-409, Dec. 14, 1981.

Primary Examiner—Reinhard J. Eisenzopf
Assistant Examiner—Azmaz Woldu
Attorney, Agent, or Firm—Sughrue, Mion, Zinn, Macpeak & Seas

[57] ABSTRACT

A radio station presetting method for radio receivers performs seek-scanning to select a predetermined number of radio stations with a reception field strength higher than a specified level in descending order of reception field strength and to set data of the selected stations in a station-presetting memory. A predetermined number of radio stations with a reception field strength higher than the specified level which are not set in the station-presetting memory are stored in a second memory. Each time specific station data set in the station-presetting memory is desired to be deleted, the specified station data from the station-presetting memory is deleted and station data in the second memory with the highest reception field strength is written into the station-presetting memory and erased from the second memory.

4 Claims, 3 Drawing Sheets

RADIO STATION PRESETTING METHOD FOR RADIO RECEIVERS

BACKGROUND OF THE INVENTION

1. Field of the Invention

The present invention relates to a radio station presetting method for radio receivers, in which, by performing seek-scanning, a predetermined number of radio stations with the reception field strength higher than a specified level are selected in the order of reception field strength, starting with a station with the highest reception level, and then set in memory and in which the data of such preset radio stations can be rewritten.

2. Prior Art

Radio receivers have been available that have a function to set data of radio stations in memory, which is generally called either a best station memory (BSM) function, a best station sequential memory (BSSM) function or an auto preset memory function. (Here, we call it a set-station-data-in-memory procedure for convenience.)

This BSM function, BSSM function or auto preset memory function, whatever they are called, performs seek-scanning and selects in the descending order of reception field strength a predetermined number of stations, for example six stations, with the reception field strengths above a specified level, and then stores the data of the selected stations in memory.

After the data of the predetermined number of stations are set in memory by the BSM, BSSM or auto preset memory function (the set-station-data-in-memory procedure), a tuning key (preset channel key) in the operation section corresponding to the desired station is pressed to tune in to that station.

With the conventional radio station presetting method for radio receivers, however, since the predetermined number of radio stations with their reception field strengths higher than a specified level are selected by seek-scanning in the order of reception level and the data of these selected stations are set in the memory (the set-station-data-in-memory procedure), data of unwanted stations may also be stored in memory if their reception field strength is higher than the specified level.

It has not been possible to erase any preset data of radio stations. That is, the data of unwanted stations cannot be removed from memory and replaced with data of other desired stations.

SUMMARY OF THE INVENTION

The present invention has been accomplished to eliminate the above-mentioned inconvenience experienced with the conventional system. The object of this invention is to provide a radio station presetting method for radio receivers which makes it possible to rewrite the data of radio stations preset in memory to improve the usefulness and versatility of the radio receiver.

A radio station presetting method for radio receivers according to this invention, comprises the steps of: storing in a second memory a predetermined number of radio stations with the reception field strength higher than a specified level which are not set in a station-presetting memory; each time specific station data set in the station-presetting memory is specified for data rewriting, deleting the specified station data from the station-presetting memory, and then writing into the station-presetting memory station data in the second memory with the highest reception field strength; and then erasing the station data in the second memory with the highest reception field strength.

In a radio station presetting method for radio receivers according to the second embodiment, the station data set in the station-presetting memory are made to correspond, one to one, to presetting channels in the descending order of reception field strength, and each time the data rewriting is specified for certain station data set in the station-presetting memory, the specified station data is deleted from the station-presetting memory and the succeeding station data in the station-presetting memory are shifted up one memory location successively to fill the deleted memory location.

In a radio station presetting method for radio receivers according to the third embodiment, the station data deleted from the station-presetting memory is stored in a third memory, and when the set-station-data-in-memory procedure is performed again, the station data equal to the one stored in the third memory is excluded from among station data to be stored in the station-presetting memory and the second memory, and when the station data stored in the third memory is specified for recovery from the exclusion from the set-station-data-in-memory procedure, that station data is deleted from the third memory.

With the radio station presetting method for radio receivers according to this invention, when it is requested to rewrite specific data among the selected stations preset in a station-presetting memory, the specified data can be replaced with data of a radio station in a second memory with the highest reception field strength among those contained in the second memory.

When the radio station data erased from the memory is stored in a third memory and then the set-station-data-in-memory procedure is requested again, the station data equal to the one stored in the third memory is excluded from the station-presetting memory and the second memory in the future set-station-data-in-memory procedure. When it is requested to recover the station data from the exclusion, the data stored in the third memory is deleted.

DESCRIPTION OF THE PREFERRED EMBODIMENT

One embodiment of this invention will be described by referring to the accompanying drawings.

Figure 1:
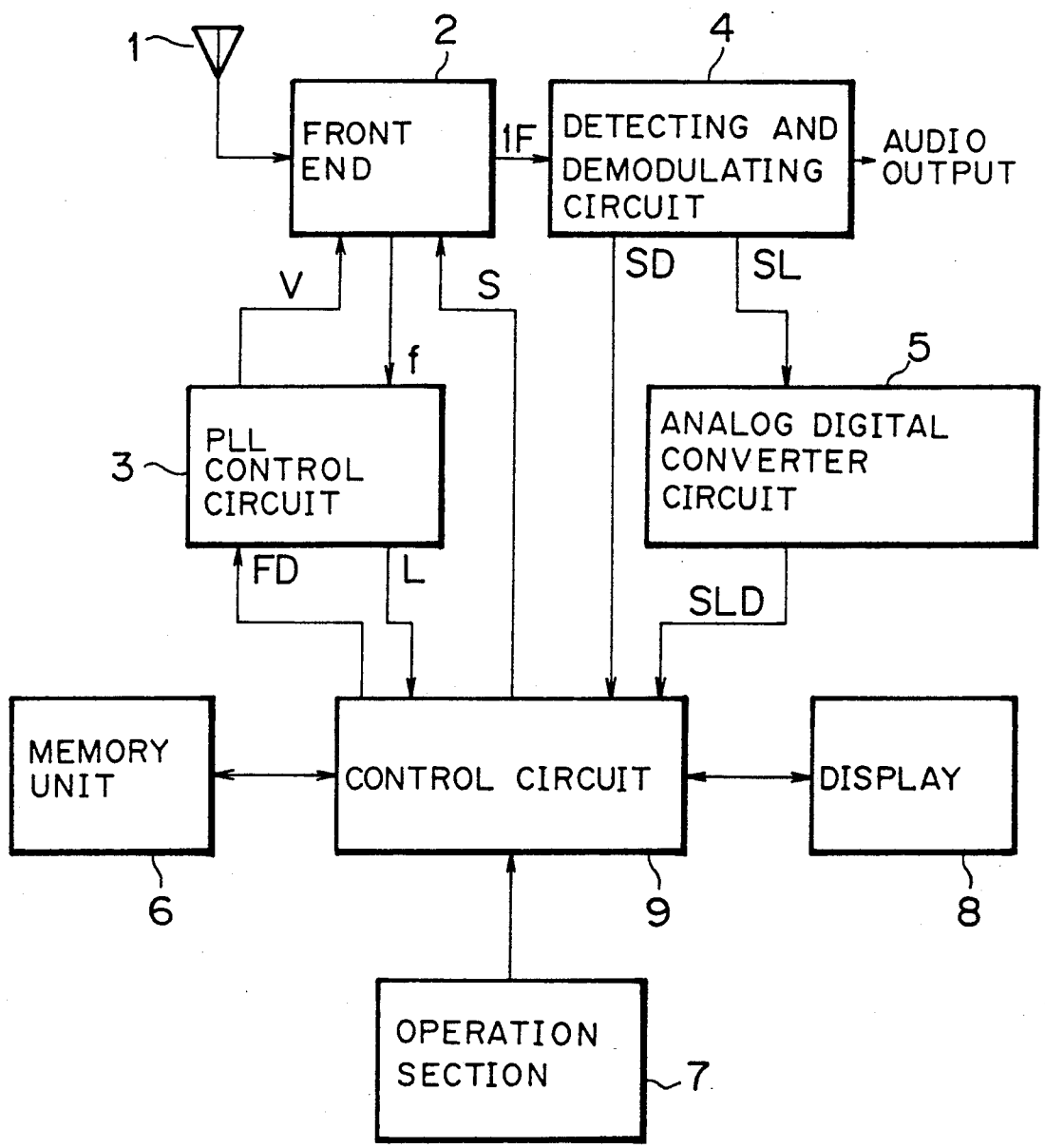
FIG. 1 is a block diagram showing the configuration of a radio receiver as one embodiment of this invention.

FIG. 1 is a block diagram showing the configuration of a radio receiver as one embodiment of this invention.

In the figure, reference numeral 1 represents an antenna to receive radio waves. Denoted 2 is a front end, which, according to a tuning voltage V output from a PLL (phase-lock loop) control circuit 3, determines a receiving frequency f from the antenna 1 and which outputs the received frequency f to the PLL control circuit 3 and at the same time converts into an IF (intermediate frequency) signal the reception frequency f which is higher than an input sensitivity setting signal S from a control circuit 9 described later.

Designated 3 is a PLL control circuit composed of PLL which sends the tuning voltage V produced according to a frequency division ratio data FD of the control circuit 9 to the front end 2 and which, when supplied the reception frequency f corresponding to the tuning voltage V, outputs a lock completion signal L to the control circuit 9.

Denoted 4 is a detecting and demodulating circuit which detects the IF signal from the front end 2 and demodulates it into an audio signal before outputting it. The detecting and demodulating circuit 4 also outputs a station detecting signal SD and a reception field strength signal SL.

Designated 5 is an analog-digital converter circuit that converts the reception field strength signal SL from the detecting and demodulating circuit 4 into a field strength signal SLD, which is a digital signal. Denoted 6 is a memory unit which stores a variety of data according to the control from the control circuit 9.

The memory 6 can store preset data of six radio stations.

An operation section 7 has a variety of keys and switches to initiate specified operations.

A display 8 shows a key number of preset channel key (PCH key) corresponding to the stations tuned in and also the frequency being received.

Denoted 9 is a control circuit which controls the front end 2, PLL control circuit 3, memory unit 6 and display 8 as described in the following according to the outputs from the PLL control circuit 3, detecting and demodulating circuit 4, analog-digital converter circuit 5, and operation section 7 and also to the data of the memory unit 6.

Figure 2:
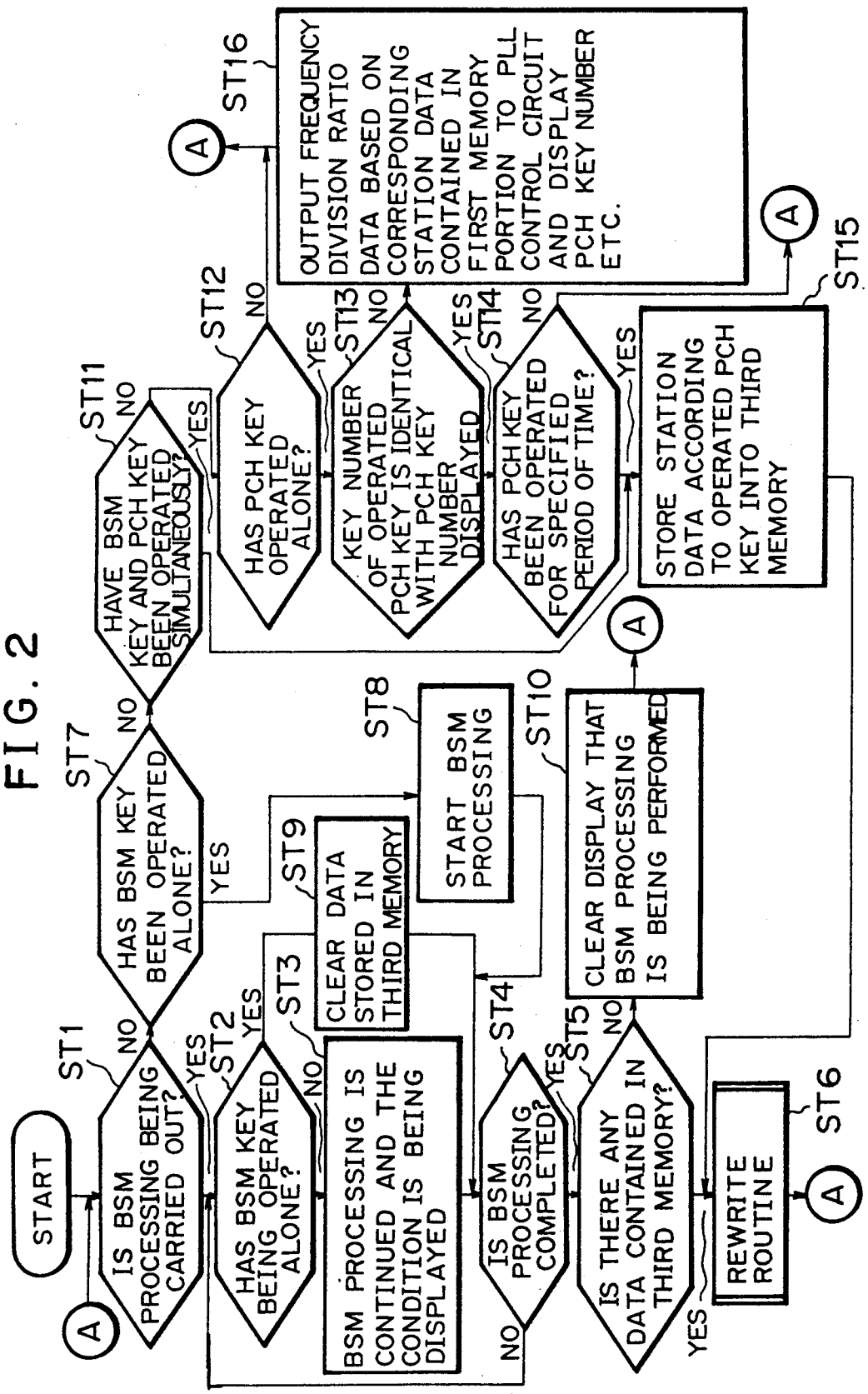
FIG. 2 is a flowchart showing one example sequence of operation performed by this invention.

FIG. 2 is a flowchart showing one example sequence of operation, and ST1 to ST16 represent each step.

Figure 3A:
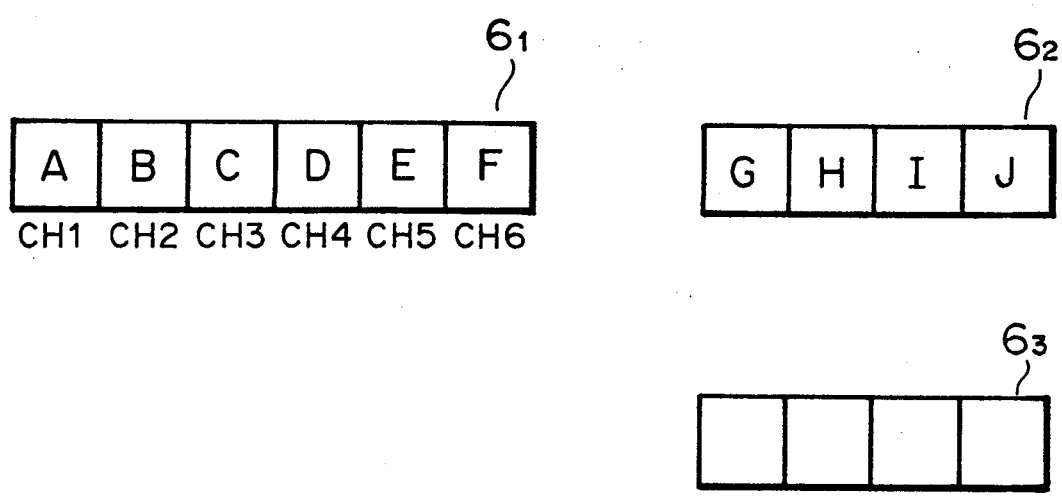
FIGS. 3A and 3B are schematic diagram showing how the station data is rewritten.
Figure 3B:
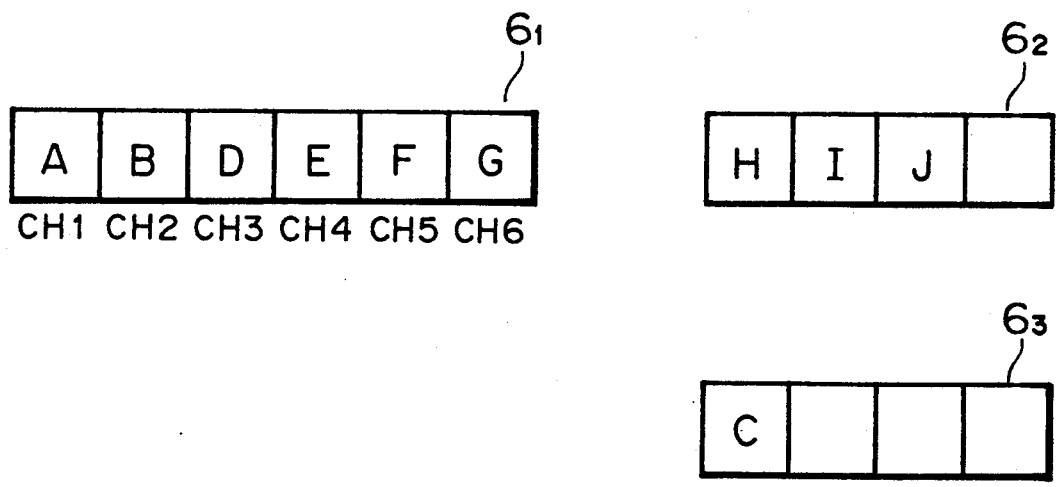

FIGS. 3A and 3B are diagrams showing how the preset station data is rewritten. $6_1$ is a first memory portion to store the preset station data; $6_2$ is a second memory portion that stores data of a predetermined number of radio stations, say four stations, which have been chosen in the descending order of the reception field strength from among those with the reception field strengths higher than a specified level; and $6_3$ is a third memory portion to store station data which has been preset but is specified to be rewritten. These memory portions make up the memory unit 6.

The reception field strength of the radio stations A, B, C, D, ... decreases in the order of station A, station B, station C, station D, ...

CH indicates preset channels that correspond to the preset channel keys (PCH keys).

Now, we will explain about the operation of the system.

Let us assume that the data of the radio stations A to J are stored in the first and second memory portions $6_1$, $6_2$ of the memory unit 6 by the BSM function as shown in FIG. 3A.

The operation of setting the station data by the BSM function is well known and thus its explanation is skipped here.

Next, the operation of this invention will be explained.

First, the power key on the operation section 7 is manipulated to turn on power of the system. Then the control circuit 9 controls the PLL control circuit 3 to set the reception frequency to the station that was previously tuned in, and at the same time displays a ICH key number on the display 8 if the station tuned in has the corresponding PCH key.

In this condition, the control circuit 9 checks if the BSM processing is being carried out (step ST1). If the BSM processing is found to be under way, the control circuit 9 then makes a check to see if the BSM key on the operation section 7 has been operated alone (step ST2). When the BSM key has not been operated solely, the control circuit continues the BSM processing and shows on the display 8 a message indicating that the BSM processing is being performed (step ST3) and then checks if the BSM processing is completed (step ST4).

If the check at step ST4 finds that the BSM processing is not yet finished, the control circuit 9 returns to step ST2; if that processing is completed, it is now checked whether there is any station data contained in the third memory portion $6_3$ (step ST5). When the station data is found contained in the third memory portion $6_3$, the control circuit proceeds to a rewrite routine to rewrite the station data in the first and second memory portions $6_1$, $6_2$ (step ST6).

The rewrite routine, when the rewrite processing is finished, terminates the indication on the display 8 that the BSM processing is being carried out. The rewrite processing will be detailed later on.

Next, when at step ST1 the BSM processing is found to be not being performed, the control circuit checks whether the BSM key has been operated alone (step ST7). If the BSM key has been operated alone, the program starts the BSM processing (step ST8) and moves to step ST4.

When the BSM key is found at step ST2 to have been operated solely, the program clears the station data stored in the third memory portion $6_3$ before going to step ST4.

Further, when the step ST5 finds that there is no station data in the third memory portion $6_3$, the indication on the display 8 that the BSM processing is being performed is cleared (step ST10).

When the step ST7 has found that the BSM key has not been operated alone, it is checked if the BSM key and the PCH key have been operated simultaneously (step ST11). When these two keys are not operated at once, then the program checks if the PCH key has been operated alone (step ST12).

When the step ST12 finds that the PCH key has been operated alone, the program further checks to see if the key number of the operated PCH key is the PCH key number indicated on the display 8 (step ST13). If the key number of the operated PCH key is identical with the one shown on the display 8, a check is made to see whether the PCH key has been operated (or depressed) for a specified period of time, say more than two seconds (step ST14).

Then, if the step ST14 finds that the PCH key has been pressed for more than 2 seconds, or if the step ST11 determines that the BSM key and the PCH key have been pressed simultaneously, the station data corresponding to the PCH key depressed is stored in the third memory portion $6_3$. The program then proceeds to step ST6.

Suppose the key number of PCH key found operated at step ST11 or steps ST13, ST14 is "3," the data of stations A to J contained in the memory portions $6_1$ to $6_3$ in FIG. 3A will be changed as shown in FIG. 3B by executing the steps ST15 and ST6.

In other words, the data in the first memory $6_1$ for station C corresponding to the PCH key 3 is copied to the third memory portion $6_3$, the data of station C for the PCH key 3 is deleted from the first memory portion $6_1$ and the data of stations D to F are all shifted up by one memory location in the first memory portion $6_1$. Then the data of station G in the second memory portion $6_2$ is written into the vacant location in the first memory portion $6_1$.

After the data of radio station G in the second memory portion $6_2$ is erased, the data of stations H to J are all shifted up by one memory location.

Therefore, when at step ST11 or steps ST13, ST14 a PCH key is found operated, the step ST15 sets the data of stations corresponding to the operated PCH keys into the third memory portion $6_3$ successively.

When the step ST13 determines that the operated PCH key number is not the PCH key number shown on the display 8, the control circuit 9 outputs to the PLL control circuit 3 the frequency division ratio data FD based on the corresponding station data contained in the first memory portion $6_1$ and at the same time displays the PCH key number and frequency on the display 8 (step ST16). With steps ST6 and ST10 executed, when the step ST12 finds that the PCH key has not been operated alone or when the step ST14 finds the PCH key to have not been pressed for more than two seconds, the program proceeds to step ST1.

As explained above, with the station data preset in memory, it is possible to remove an unwanted station data from the first memory portion $6_1$ by the data rewriting function, improving the usefulness and versatility of the radio receiver.

Furthermore, when, with the station data deleted from the first memory portion $6_1$ and stored in the third memory portion $6_3$ by the data rewriting function, the set-station-data-in-memory procedure is performed again, that station data is prevented from being stored into the first memory in the future set-station-data-in-memory procedure. Therefore, it is possible to prevent unwanted station data from being set in the first memory portion $6_1$ by simply performing the set-station-data-in-memory procedure on the unwanted station data in the third memory portion.

While in the above embodiment the first to third memory portions $6_1$ to $6_3$ are provided in the memory unit 6, these memory portions may be provided as separate memory units.

In this embodiment, the station data are selected and stored in the station-presetting memory (first memory portion $6_1$) and the second memory (second memory portion $6_2$) in the descending order of reception field strength and the station data contained in the station-presetting memory are set automatically. When specific station data is deleted from the station-presetting memory, the succeeding station data are shifted up one memory location successively. In this case, however, instead of shifting up the station data, it is possible to write into the deleted location in the first station-resetting memory the station data in the second memory with the highest field strength and then delete that data in the second memory which was written into the station-presetting memory.

In this invention, when specific station data set in the station-presetting memory is selected for rewriting, the selected data is replaced with station data in the second memory with the highest reception field strength. Hence, it is possible to remove any unwanted station data from the station-presetting memory.

After the station data that was deleted from the station presetting memory is stored in the third memory or station exclusion memory, when the set-station-data-in-memory procedure is performed again, station data equal to the one contained in the third memory is prevented from being stored in the station-presetting memory and second memory during the future set-station-data-in-memory process. Then, when the station exclusion is reset, the station data contained in the third memory is deleted. In this manner, it is possible to remove any specific station data from the station-presetting memory or allow that station data to be set in the station-presetting memory again. This significantly improves the versatility of the system.

What is claimed is:

1. In a radio station presetting method for radio receivers, in which seek-scanning is performed to select a predetermined number of radio stations with reception field strength higher than a specified level in descending order of reception field strength and to set data of the selected stations in a station-presetting first memory, said method comprising the steps of:

storing in a second memory a predetermined number of radio stations with reception field strength higher than the specified level and which are not set in the station-presetting first memory;

each time specific station data set in the station-presetting first memory is specified for data deletion, deleting the specified station data from the first station-presetting memory, and then writing into the first station-presetting memory that station data from the second memory with the highest reception field strength; and then erasing that station data from the second memory.

2. A radio station presetting method for radio receivers as claimed in claim 1, wherein said station data set in the station-presetting memory are made to correspond, one to one, to presetting channels in the descending order of reception field strength, and each time the data rewriting is specified for certain station data set in the station-presetting memory, the specified station data is deleted from the station-presetting memory and succeeding station data in the station-presetting memory are shifted up one memory location successively to fill the deleted memory location.

3. A radio station presetting method for radio receivers as claimed in claim 1 or claim 2, wherein said station data deleted from the station-presetting memory is stored in a third memory, and when the set-station-data-in-memory procedure is performed again, the station data equal to the one stored in the third memory is excluded from among station data to be stored in the station-presetting memory and the second memory.

4. A radio station presetting method for radio receivers as claimed in claim 3, wherein when the station data stored in the third memory is specified for recovery from the exclusion from the set-station-data-in-memory procedure, that station data is deleted from the third memory.

* * * * *